(12) United States Patent
Lee et al.

(10) Patent No.: US 8,326,151 B2
(45) Date of Patent: Dec. 4, 2012

(54) LOW-COST WDM SOURCE WITH AN INCOHERENT LIGHT INJECTED FABRY-PEROT LASER DIODE

(75) Inventors: Chang Hee Lee, Taejon (KR); Hyun Deok Kim, Daegu (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 13/042,383

(22) Filed: Mar. 7, 2011

(65) Prior Publication Data

US 2011/0211838 A1  Sep. 1, 2011

Related U.S. Application Data

(60) Division of application No. 11/493,519, filed on Jul. 27, 2006, now Pat. No. 7,903,979, which is a continuation of application No. 09/732,773, filed on Dec. 11, 2000, now Pat. No. 7,106,974.

(30) Foreign Application Priority Data

Dec. 21, 1999  (KR) .............................. 1999-0059923

(51) Int. Cl.
 *H04J 14/00* (2006.01)
(52) U.S. Cl. ........................................................ 398/68
(58) Field of Classification Search .................... 398/68, 398/79
 See application file for complete search history.

(56) References Cited

U.S. PATENT DOCUMENTS

| | | |
|---|---|---|
| 4,341,438 A | 7/1982 | Seki et al. |
| 4,563,087 A | 1/1986 | Bourbin et al. |
| 4,912,526 A | 3/1990 | Iwaoka et al. |
| 4,947,134 A | 8/1990 | Olsson |
| 5,064,263 A | 11/1991 | Stein |
| 5,117,303 A | 5/1992 | Desurvire et al. |

(Continued)

FOREIGN PATENT DOCUMENTS

EP  0 060 033 A  9/1982

(Continued)

OTHER PUBLICATIONS

Hyun Deok Kim, et al., "A Low-Cost WDM Source with an ASE Injected Fabry-Perot Semiconductor Laser," XP000968561, IEEE Photonics Technology Letters, vol. 12, No. 8, pp. 1067-1069 (Aug. 2000).

(Continued)

*Primary Examiner* — Shi K Li
(74) *Attorney, Agent, or Firm* — Blakely, Sokoloff, Taylor & Zafman LLP.

(57) ABSTRACT

The present invention discloses a low-cost light source for optical transmission systems and optical networks based on wavelength-division multiplexing (WDM) technology. A light source in accordance with the present invention is implemented by externally injecting a narrow-band incoherent light into a Fabry-Perot laser diode (F-P LD). After injection of narrow-band incoherent light, the output of F-P LD becomes wavelength-selective rather than multi-mode and the output wavelength of F-P LD coincide with the peak wavelength of the injected incoherent light.

Multi-channel WDM light sources according to the present invention can be implemented using a single broadband incoherent light source and plurality of F-P LDs. An optical transmission system for upstream signal transmission in an passive optical network using the light source according the present invention is also disclosed.

8 Claims, 11 Drawing Sheets

U.S. PATENT DOCUMENTS

| | | | |
|---|---|---|---|
| 5,202,780 A | 4/1993 | Fussanger | |
| 5,221,983 A | 6/1993 | Wagner | |
| 5,251,001 A | 10/1993 | Dave et al. | |
| 5,251,054 A | 10/1993 | Lynn | |
| 5,276,543 A | 1/1994 | Olshansky | |
| 5,307,366 A | 4/1994 | Auffret et al. | |
| 5,321,541 A | 6/1994 | Cohen | |
| 5,347,525 A | 9/1994 | Faris | |
| 5,379,309 A | 1/1995 | Logan, Jr. et al. | |
| 5,408,349 A | 4/1995 | Tsushima et al. | |
| 5,412,673 A | 5/1995 | Caprara et al. | |
| 5,418,183 A | 5/1995 | Joyner et al. | |
| 5,434,662 A | 7/1995 | Rockwell et al. | |
| 5,436,760 A | 7/1995 | Nakabayashi | |
| 5,440,417 A | 8/1995 | Chung et al. | |
| 5,491,573 A | 2/1996 | Shipley | |
| 5,550,666 A | 8/1996 | Zirngibl | |
| 5,589,970 A | 12/1996 | Lyu et al. | |
| 5,600,471 A | 2/1997 | Hirohashi et al. | |
| 5,625,478 A | 4/1997 | Doerr et al. | |
| 5,646,774 A | 7/1997 | Takara et al. | |
| 5,661,585 A | 8/1997 | Feldman et al. | |
| 5,694,234 A | 12/1997 | Darcie et al. | |
| 5,773,345 A | 6/1998 | Ota | |
| 5,793,512 A | 8/1998 | Ryu | |
| 5,796,502 A | 8/1998 | Haller, Jr. | |
| 5,812,572 A | 9/1998 | King et al. | |
| 5,835,517 A | 11/1998 | Jayaraman et al. | |
| 5,841,557 A | 11/1998 | Otsuka et al. | |
| 5,864,414 A | 1/1999 | Barnsley et al. | |
| 5,880,865 A | 3/1999 | Lu et al. | |
| 5,894,247 A | 4/1999 | Yoshida et al. | |
| 5,907,417 A | 5/1999 | Darcie et al. | |
| 5,920,414 A | 7/1999 | Miyachi et al. | |
| 5,936,752 A * | 8/1999 | Bishop et al. | 398/90 |
| RE36,471 E | 12/1999 | Cohen | |
| 6,034,799 A | 3/2000 | Hansen | |
| 6,081,355 A | 6/2000 | Sharma et al. | |
| 6,097,523 A | 8/2000 | Boot | |
| 6,120,190 A | 9/2000 | Mirman et al. | |
| 6,134,037 A | 10/2000 | Shabeer et al. | |
| 6,134,250 A | 10/2000 | Koren et al. | |
| 6,137,611 A | 10/2000 | Boivin et al. | |
| 6,178,001 B1 | 1/2001 | Kim | |
| 6,192,170 B1 | 2/2001 | Komatsu | |
| 6,195,200 B1 * | 2/2001 | DeMarco et al. | 359/337.21 |
| 6,304,350 B1 | 10/2001 | Doerr et al. | |
| 6,307,668 B1 | 10/2001 | Bastien et al. | |
| 6,310,720 B1 | 10/2001 | Walker et al. | |
| 6,323,994 B1 | 11/2001 | Li et al. | |
| 6,437,907 B1 | 8/2002 | Yoon et al. | |
| 6,469,649 B1 | 10/2002 | Helkey et al. | |
| 6,470,036 B1 | 10/2002 | Bailey et al. | |
| 6,498,869 B1 * | 12/2002 | Yao | 385/11 |
| 6,498,871 B1 | 12/2002 | Kuboki | |
| 6,597,482 B1 | 7/2003 | Chung et al. | |
| 6,600,760 B1 | 7/2003 | Green et al. | |
| 6,603,599 B1 | 8/2003 | Wang et al. | |
| 6,650,840 B2 | 11/2003 | Feldman | |
| 6,654,401 B2 | 11/2003 | Vieira et al. | |
| 6,674,969 B1 | 1/2004 | Ogusu | |
| 6,711,313 B2 | 3/2004 | Takiguchi et al. | |
| 6,771,358 B1 | 8/2004 | Shigehara et al. | |
| 6,868,200 B2 | 3/2005 | Kimotsuki et al. | |
| 6,868,236 B2 | 3/2005 | Wiltsey et al. | |
| 6,888,856 B2 | 5/2005 | Green et al. | |
| 6,941,074 B2 | 9/2005 | Nakamura et al. | |
| 7,006,719 B2 | 2/2006 | Joyner et al. | |
| 7,075,712 B2 | 7/2006 | Kinoshita et al. | |
| 7,092,595 B2 | 8/2006 | Sorin et al. | |
| 7,106,974 B2 | 9/2006 | Lee et al. | |
| 7,171,123 B2 | 1/2007 | Lee et al. | |
| 7,254,344 B2 | 8/2007 | Kim et al. | |
| 7,313,157 B2 | 12/2007 | Sorin et al. | |
| 7,327,957 B2 | 2/2008 | Lee et al. | |
| 7,349,631 B2 | 3/2008 | Lee et al. | |
| 7,403,718 B2 | 7/2008 | Matthews et al. | |
| 7,415,205 B2 | 8/2008 | Shin et al. | |
| 7,593,444 B2 | 9/2009 | Sorin et al. | |
| 7,613,398 B2 | 11/2009 | Lee et al. | |
| 7,627,246 B2 | 12/2009 | Sorin et al. | |
| 2001/0004290 A1 | 6/2001 | Lee et al. | |
| 2001/0013962 A1 | 8/2001 | Li et al. | |
| 2001/0046364 A1 | 11/2001 | Ajima et al. | |
| 2002/0039465 A1 | 4/2002 | Skinner | |
| 2002/0067526 A1 | 6/2002 | Park et al. | |
| 2002/0068859 A1 | 6/2002 | Knopp | |
| 2002/0071173 A1 | 6/2002 | Lee et al. | |
| 2002/0097768 A1 | 7/2002 | Thornton | |
| 2002/0126345 A1 | 9/2002 | Chapman et al. | |
| 2002/0196491 A1 | 12/2002 | Deng et al. | |
| 2003/0007207 A1 | 1/2003 | Healy et al. | |
| 2003/0039010 A1 | 2/2003 | Akimoto et al. | |
| 2003/0058500 A1 | 3/2003 | Sugawara | |
| 2003/0076560 A1 | 4/2003 | Pratt et al. | |
| 2003/0095736 A1 | 5/2003 | Kish, Jr. et al. | |
| 2003/0128917 A1 | 7/2003 | Turpin et al. | |
| 2003/0142978 A1 | 7/2003 | Lee et al. | |
| 2003/0165006 A1 | 9/2003 | Stephens et al. | |
| 2003/0205706 A1 | 11/2003 | Lin et al. | |
| 2003/0206740 A1 | 11/2003 | Lee et al. | |
| 2003/0223672 A1 | 12/2003 | Joyner et al. | |
| 2003/0223761 A1 | 12/2003 | Brown et al. | |
| 2004/0033004 A1 | 2/2004 | Welch et al. | |
| 2004/0033076 A1 | 2/2004 | Song et al. | |
| 2004/0067059 A1 | 4/2004 | Song et al. | |
| 2004/0131358 A1 | 7/2004 | Jung et al. | |
| 2004/0136716 A1 | 7/2004 | Jung et al. | |
| 2004/0175188 A1 | 9/2004 | Bellemare et al. | |
| 2004/0184805 A1 | 9/2004 | Shin et al. | |
| 2004/0184806 A1 | 9/2004 | Lee et al. | |
| 2004/0208208 A1 | 10/2004 | Shin et al. | |
| 2004/0264400 A1 | 12/2004 | Lee et al. | |
| 2005/0135449 A1 | 6/2005 | Sorin et al. | |
| 2005/0147412 A1 | 7/2005 | Park et al. | |
| 2005/0152696 A1 | 7/2005 | Shin et al. | |
| 2005/0163503 A1 | 7/2005 | Lee et al. | |
| 2005/0259989 A1 | 11/2005 | Sorin et al. | |
| 2005/0286895 A1 | 12/2005 | Lee et al. | |
| 2006/0002706 A1 | 1/2006 | Lee et al. | |
| 2006/0045542 A1 | 3/2006 | Chu et al. | |
| 2006/0093360 A1 | 5/2006 | Kim et al. | |
| 2006/0262324 A1 | 11/2006 | Hays et al. | |
| 2006/0263090 A1 | 11/2006 | Lee et al. | |
| 2007/0014509 A1 | 1/2007 | Kish, Jr. et al. | |
| 2007/0081823 A1 | 4/2007 | Lee et al. | |
| 2007/0274729 A1 | 11/2007 | Lee et al. | |
| 2008/0089692 A1 | 4/2008 | Sorin et al. | |
| 2008/0137698 A1 | 6/2008 | Sorin et al. | |
| 2008/0232805 A1 | 9/2008 | Lee et al. | |
| 2010/0221008 A1 | 9/2010 | Lee et al. | |

FOREIGN PATENT DOCUMENTS

| | | |
|---|---|---|
| EP | 0 607 029 A | 7/1994 |
| EP | 0 688 114 A | 12/1995 |
| EP | 0 844 706 A2 | 5/1998 |
| EP | 0 844 706 A3 | 2/1999 |
| EP | 0 991 217 A2 | 4/2000 |
| EP | 1 024 541 A | 8/2000 |
| EP | 1 089 098 A | 4/2001 |
| EP | 1 124 296 A2 | 8/2001 |
| EP | 1 195 867 A1 | 4/2002 |
| EP | 1 388 963 A2 | 2/2004 |
| GB | 2 122 371 A | 1/1984 |
| JP | 61-114624 | 6/1986 |
| JP | 02-261236 | 10/1990 |
| JP | 06-252860 | 9/1994 |
| JP | 8-163097 | 6/1996 |
| JP | 09-233052 | 9/1997 |
| JP | 10-23478 | 1/1998 |
| JP | 11-211924 | 8/1999 |
| JP | 2000-174397 | 6/2000 |
| JP | 2000-196536 | 7/2000 |
| JP | 2000-292636 | 10/2000 |
| JP | 2001-127377 | 5/2001 |
| JP | 2001-188140 | 7/2001 |
| JP | 2001-203643 | 7/2001 |

| | | |
|---|---|---|
| JP | 2001-230733 | 8/2001 |
| JP | 2001-257658 | 9/2001 |
| JP | 2001-356377 | 12/2001 |
| JP | 2002-141927 | 5/2002 |
| JP | 2002-374207 | 12/2002 |
| JP | 2003-17798 | 1/2003 |
| JP | 2003-69502 | 3/2003 |
| JP | 2003-124893 | 4/2003 |
| JP | 2003-124911 | 4/2003 |
| JP | 2003-134058 | 5/2003 |
| JP | 2004-159328 | 3/2004 |
| KR | 00-33946 | 6/2000 |
| KR | 10-2000-0033946 A | 6/2000 |
| KR | 00-39036 | 7/2000 |
| KR | 01-93921 | 10/2001 |
| KR | 2002-0005326 | 1/2002 |
| KR | 0325687 | 2/2002 |
| KR | 10-2003-0063085 A | 7/2003 |
| KR | 10-2003-0065632 A | 8/2003 |
| KR | 10-2003-0086223 A | 11/2003 |
| KR | 10-2002-0083410 | 1/2004 |
| KR | 10-2004-0023305 A | 3/2004 |
| KR | 10-2004-0025304 A | 3/2004 |
| KR | 0454887 | 10/2004 |
| KR | 10-2004-0103085 A | 12/2004 |
| KR | 0496710 | 6/2005 |
| KR | 10-0515259 | 9/2005 |
| KR | 10-2006-0042486 A | 5/2006 |
| KR | 10-2007-0021122 | 2/2007 |
| KR | 10-0680815 | 2/2007 |
| WO | WO 97/49248 A1 | 12/1997 |
| WO | WO 98/32196 A1 | 7/1998 |
| WO | WO 98/45974 A2 | 10/1998 |
| WO | WO 99/37002 A1 | 7/1999 |
| WO | WO 99/59010 A1 | 11/1999 |
| WO | WO 00/05788 | 2/2000 |
| WO | WO 00/10271 | 2/2000 |
| WO | WO 03/063401 A2 | 7/2003 |
| WO | WO 03/065621 A1 | 8/2003 |
| WO | WO 03/107057 A1 | 12/2003 |
| WO | WO 2004/028047 A1 | 4/2004 |
| WO | WO 2004/034621 A2 | 4/2004 |
| WO | WO 2004/034621 A3 | 4/2004 |
| WO | WO 2004/047344 | 6/2004 |
| WO | WO 2004/059915 A1 | 7/2004 |
| WO | WO 2004/107626 A1 | 12/2004 |
| WO | WO 2005/069516 A1 | 7/2005 |
| WO | WO 2005/099148 A1 | 10/2005 |
| WO | WO 2006/005981 A1 | 1/2006 |
| WO | WO 2007/027042 A1 | 3/2007 |

OTHER PUBLICATIONS

Robert D. Feldman, et al., "An Evaluation of Architectures Incorporating Wavelength Division Multiplexing for Broad-Band Fiber Access," Journal of Lightwave Technologies, vol. 16, No. 9, pp. 1546-1559 (Sep. 1998).
H. Takahashi, et al., "Transmission characteristics of arrayed-waveguide NxN,vavelenth multiplexer," IEEE Photonic Technology Letters, vol. 13, No. 3. pp. 447-455 (Mar. 1995).
International Telecommunication Union (ITU), ITU-T: G.983.1. Series G: Transmission Systems and Media Digital Systems and Networks, Digital transmission systems—Digital sections and digital line system—Optical line systems for local and access networks, Broadband optical access systems based on Passive Optical Networks (PON) (Oct. 1998).
PCT Notification of Transmittal of The International Search Report and the Written Opinion of the International Searching Authority or The Declaration for PCT Counterpart Application No. PCT/US2004/031407 Containing International Search Report (Feb. 9, 2005).
Jae-Sung Lee, "Signal-to-Noise Ratio Measurement of a 2.5-Gb/s Spectrum-Sliced Incoherent Light Channel," IEEE Photonics Technology Letters, vol. 9, No. 1, pp. 94-96 (Jan. 1997).
Zirngibl, M., et al., "An 18-Channel Multifrequency Laser", IEEE Photonics Technology Letters, vol. 8. No. 7, Jul. 1996, pp. 870-872 (3 pages).
Chang-Hasnain et al., "Integrated external cavity quantum well laser array using single epitaxial growth on a patterned substrate," Applied Physics Letters, vol. 56, No. 5 (Jan. 1990).
International Preliminary Report on Patentability for PCT Counterpart Application No. PCT/US2004/031407 (Jun. 29, 2006).
Zah, C. et al., "Amplifiers with Angled Facets, Fabrication and Performance of 1.5MUM GAINASP Traveling-Wave Laser," Electonics Letters, IEE Stevenage, GB, vol. 23, No. 19, Sep. 10, 1987, pp. 990-992, XP000710298, ISSN: 0013-5194.
M. Zirngibl, et al., "Study of Spectal Slicing for Local Access Applications," IEEE Photonics Technology Letters, vol. 8, No. 5, pp. 721-723 (May 1996).
D.K. Jung, et al., "Wavelength-Division-Multiplexed Passive Optical Network Based on Spectrum-Sliced Techniques," IEEE Photonics Technology Letters, vol. 10, No. 9, pp. 1334-1336 (Sep. 1998).
S.L. Woodward, et al., "A Spectrally Sliced PON Employing Fabry-Perot Lasers," IEEE Photonics Technology Letters, vol. 10, No. 9, pp. 1337-1339 (Sep. 1998).
Klaus Petermann, "Laser Diode Modulation and Noise," Section 7: Noise Characteristics of Solitary Laser Diodes, Section 7.3.2 Mode Partition Noise, pp. 163-166 (1988).
Katsushi Iwashita, et al., "Suppression of Mode Partition Noise by Laser Diode Light Injection," IEEE Journal of Quantum Electronics, vol. QE-18, No. 10, pp. 1669-1674 (Oct. 1982).
M.D. Feuer, et al., "Singe-Port Laser-Amplifier Modulators for Local Access," IEEE Photonics Technology Letters, vol. 8, No. 9, pp. 1175-1177 (Sep. 1996).
L.Y. Chan, et al., "Upstream traffic transmitter using injection-locked Fabry-Perot laser diode as modulator for WDM access networks," XP006017703, Electronic Letters, vol. 38, No. 1, pp. 43-45 (Jan. 3, 2002).
Dong Jae Shin, et al., "Hybrid WDM/TDM-PON with Wavelength-Selection-Free Transmitters," Journal of Lightwave Technology, vol. 23, No. 1, pp. 187-195 (Jan. 2005).
E. Wong, et al., "Low-cost WDM passive optical network with directly-modulated self-seeding reflective SOA," Electronics Letters, vol. 42, No. 5, 2 pages (Mar. 2, 2006).
Wai Hung, et al., "An Optical Network Unit for WDM Access Networks with Downstream DPSK and Upstream remodulated OOK Data Using Injection-Locked FP Laser," IEEE Photonics Technology Letters, vol. 15, No. 10, pp. 1476-1478 (Oct. 10, 2003).
Derek Mayweather, et al., "Wavelength Tracking of a Remote WDM Router in a Passive Optical Network," XP000624886, IEEE Photonics Technology Letters, vol. 8, No. 9, pp. 1238-1240 (Sep. 1, 1996).
J.S. Lee, et al., "Spectrum-Sliced Fiber Amplifier Light Source for Multichannel WDM Applications," IEEE Photonics Technology Letters, vol. 5, No. 12, pp. 1458-1461 (Dec. 1993).
P. Healey, et al., "Spectral Slicing WDM-PON Using Wavelength-Seeded Reflective SOAs," Electronics Letters, vol. 37, No. 19, pp. 1181-1182 (Sep. 13, 2001).
Qiao Yaojun, et al., "A New Scheme for WDM-Based Passive Optical Access Network," 4 pgs. (2000).
S.V. Kartalopoulos, Introduction to DWDM Technology: Data in a Rainbow, pp. 56-57 (2000).
Oh, Tae-Won et al., "Broadband Light Source for Wavelength-Division Multiple Access Passive Optical Network," Dept. of Electrical Engineering, Korea Advanced Institute of Science and Technology and Novera Optics Korea, Inc., Nov. 29, 2007, OECC 2003.
D.D. Sampson, et al., "100mW Spectrally-Uniform Broadband ASE Source for Sprectrum-Sliced WDM Systems," XP006001052, Electronics Letters, vol. 30, No. 19, pp. 1611-1612 (Sep. 15, 1994).
McMahon, Donald H., et al. "Echelon grating multiplexers for hierarchically multiplexed fiber-optic communication networks," Applied Optics, vol. 26, No. 11, pp. 2188-2196 (Jun. 1, 1987).
Jung, et al., "Spectrum-Sliced Bidirectional WDM PON," Optical Fiber Communication Conference, vol. 2, pp. WJ6-2 to WJ6-4 (2000).
Haruna, Masamitsu, et al., "Optical Waveguide Power Distributor and Multichannel Modulator and Demodulator," Piezo-Electricity and Acousto-optic, No. 4 of 1983, pp. 58-67, Apr. 1983.

Jinshan, Xie, "Application of Wavelength Division Multiplexing (WDM) Technology in Passive Optical Network," Development of Laser and Optoelectronics (Supplement), No. 9 of 1999, pp. 67-70, Sep. 1999.

Youlong, Yu, et al., "Study on a Novel High Power Broadband Light Source," Chinese Journal of Lasers, vol. A28, No. 1, pp. 71-73, Jan. 2001.

Yunfeng, Shen, et al., "The Research on Layering Structure and Network Management of Photonic Transport Networks," Journal of China Institute of Communications, vol. 19, No. 7, pp. 18-24, Jul. 1998.

Presby, H.M., et al., "Amplified integrated star couplers with zero loss," Photonics Technology Letters, IEEE vol. 3, Issue 8, Aug. 1991, pp. 724-726.

Shin, et al., "155 Mbit/s Transmission Using ASE-Injected Fabry-Perot Laser Diode in WDM-PON over 700C. Temperature Rage," Electronics Letters, Sep. 4, 2003, vol. 39, No. 18, pp. 1331-1332.

Choi, K.M., "Broadband Light Source by Mutually Injected FP-LD's" OECC/COIN 2004, Jan. 1, 2004, pp. 882-884, XP009126452.

Jin, Xiaomin, et al., "Bandwidth enhancement of Fabry-Perot quantum-well lasers by injection-locking" Jun. 12, 2006, Solid-State Electronics, p. 1141-9.

Takachio, N., et al., "Wide Area Gigabit Access Network based on 12.5GHz Spaced 256 Channel Super-Dense WDM Technologies", Electronic Letters, vol. 35, No. 5, XP6016306, 2 pgs., (Mar. 1, 2001).

Baik, J., et al., "Wavelength Self-Managed Optical WDM Source Using Polarization-Multiplexed Fabry-Perot Laser Diodes", IEEE Photonics Technology Letters, vol. 16, No. 10, Oct. 2004.

Kikuchi, Kazuro "Effect of 1/f-Type FM Noise on Semiconductor-Laser Linewidth Residual in High-Power Limit", IEEE Journal of Quantum Electronics, vol. 25, No. 4, Apr. 1989, pp. 684-688.

Kurtz, Russell M., et al., "Mutual Injection Locking: A New Architecture for High-Power Solid-State Laser Arrays", May/Jun. 2005, IEEE Journal of Selected Topics in Quantum Electronics, vol. 11, No. 3, pp. 578-586.

\* cited by examiner

US 8,326,151 B2

LOW-COST WDM SOURCE WITH AN INCOHERENT LIGHT INJECTED FABRY-PEROT LASER DIODE

CROSS-REFERENCED TO RELATED APPLICATIONS

The present application is a divisional application of Ser. No. 11/493,519, filed Jul. 27, 2006, which is a continuation of patent application Ser. No. 09/732,773, filed Dec. 11, 2000, which claims priority to Republic of Korea patent application number 1999-59923, filed Dec. 21, 1999.

BACKGROUND OF THE INVENTION

1. Field of the Invention

The present invention relates to a light source for optical transmission systems and optical networks based on the wavelength-division multiplexing (WDM) technology, and more particularly to a light source employing a Fabry-Perot laser diode (F-P LD) whose output wavelength is locked by an externally injected incoherent light.

The present invention also relates to WDM transmission systems and WDM passive optical networks using the above-described light sources.

2. Description of the Related Art

Recently, WDM transmission systems are widely deployed to meet the ever-growing bandwidth demands incurred by the explosion of the data traffic. In particular, WDM transmission systems begin to be deployed in metropolitan networks and access networks to accommodate wide-band services such as an electronic commerce, a cable TV, a video conference, and son on.

FIG. 1 shows a configuration of conventional WDM transmission system.

The source node is equipped with multiple transmitters (TXs) with different wavelengths ($\lambda_1 \sim \lambda_N$) and a N×1 multiplexer (MUX) and the destination node is equipped with an 1×N demultiplexer (DMUX) and multiple receivers (RXs). The source node and the destination node are connected through an single strand of optical link composed of optical fibers and optical amplifiers.

In WDM transmission systems described above, communication channels between the source node and the destination node are distinguished one another by their wavelengths. Thus, a unique wavelength is allocated each transmitter-receiver pair. The light, source of transmitter must have the unique wavelength with long-term stability and a large side mode suppression ratio (SMSR) to minimize the interference between neighboring channels. In addition, it is desirable that the light source provides a sufficient output power and has a narrow spectral width.

A representative light source which satisfies the requirements mentioned above is a distributed feedback laser diode (DFB LD). However, since a distributed feedback laser diode is expensive, incoherent light sources are usually used in an access network in which the main concern is the economical competitiveness The incoherent light sources, such as a light emitting diode (LED), a super-luminescent diode (SLD), and an optical fiber amplifier generating amplified spontaneous emission (ASE), have been used in WDM transmission systems through a spectrum-slicing application. The LED can be fabricated at low cost and modulated directly. However, the output power of LED is not sufficient to accommodate many channels through a spectrum-slicing application. The SLD is costly although it can provide much higher output power than the LED. The optical fiber amplifier can provide a strong incoherent light, ASE, but it requires expensive external modulators.

The F-P LD can provide much higher output power than the LED at the comparable cost with the LED. However, its output is multi-mode and the output power of each mode fluctuates randomly with the time due to the mode hopping and the mode partitioning. Therefore, it has been used in optical transmission systems based on time-division multiplexing technology (TDM) rather than WDM technology. Its application wavelength region was also limited near the zero dispersion wavelength of the optical fiber.

SUMMARY OF THE INVENTION

The objective of the present invention is to provide a low-cost light source for WDM application. The light source according to the present invention is implemented by externally injecting a narrow-band incoherent light into a F-P LD. Its output is wavelength-locked by the externally injected light and thus becomes wavelength-selective.

The other objective of the present invention is to provide WDM transmission systems and WDM passive optical networks employing the light source according to the present invention. The multiple sliced incoherent lights generated from a single broadband incoherent light source are injected into multiple F-P LDs simultaneously to produce multi-channel WDM light sources.

DESCRIPTION OF THE NUMERICS ON THE MAIN PARTS OF THE DRAWINGS

TX: a transmitter
RX: a receiver
MUX: a multiplexer
DMUX: a demultiplexer
ILS: an incoherent light source
TF: a tunable optical filter
CIR: an optical circulator
Pol: a polarizer
PC: a polarization controller
F-P LD: a Fabry-Perot laser diode
ILS: an incoherent light source
BPF: a band pass filter
(D)MUX: (de)MUX
ASE source: an ASE source
WGR: a waveguide grating router
AMP1, AMP2: an optical amplifier
Att.1, Att.2: an optical variable attenuator
PZF: a polarizing fiber
SMF: a conventional single mode fiber
PM: an power meter

DETAILED DESCRIPTION OF THE EMBODIMENTS

It is well known that the F-P LD shows a multi-mode output and the mode power is proportional to the spontaneous emission coupled to the mode. The output spectral distribution of the F-P LD can be changed by externally injecting a strong light into the F-P LD. Then, a mode that is the nearest from the peak wavelength of the injected light is locked by the injected light and the other modes may be suppressed. Namely, the output wavelength of F-P LD coincides with the peak wavelength injected light. As a result we can obtain a wavelength-selective output from multi-mode laser, F-P LD.

Hereinafter, referring to appended drawings, desirable embodiments of the present invention are described in detail.

Figure 1:
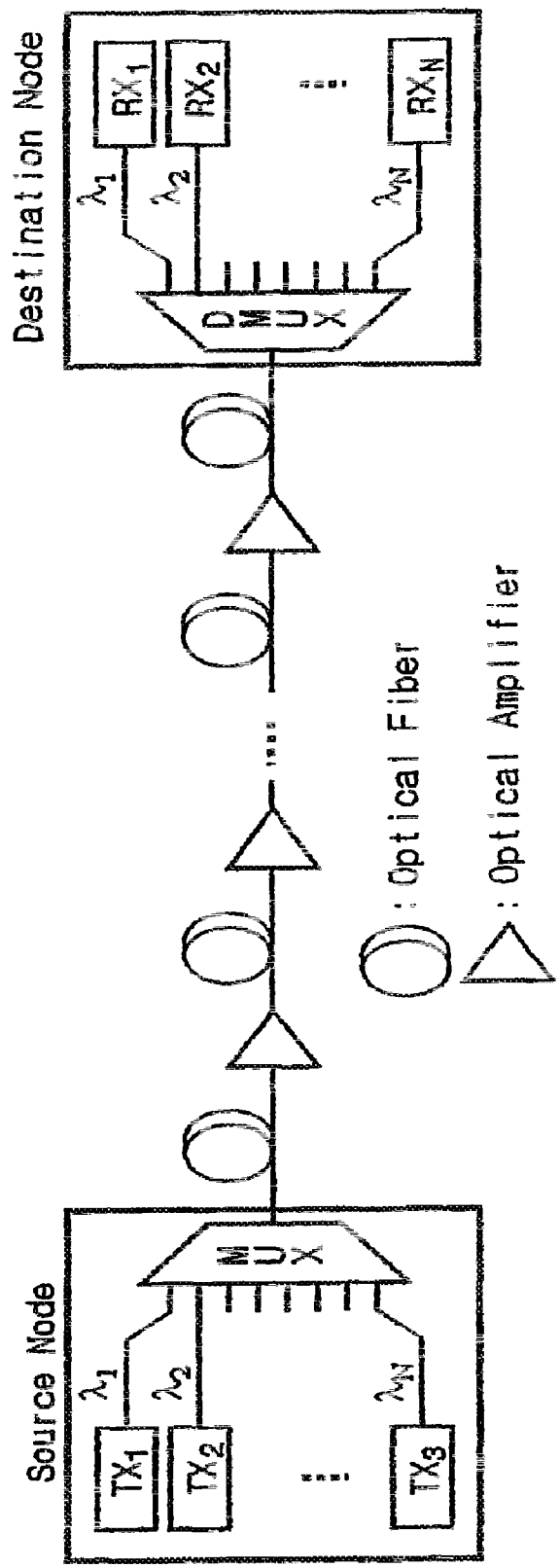
FIG. 1 shows a configuration of conventional WDM transmission system.
Figure 2:
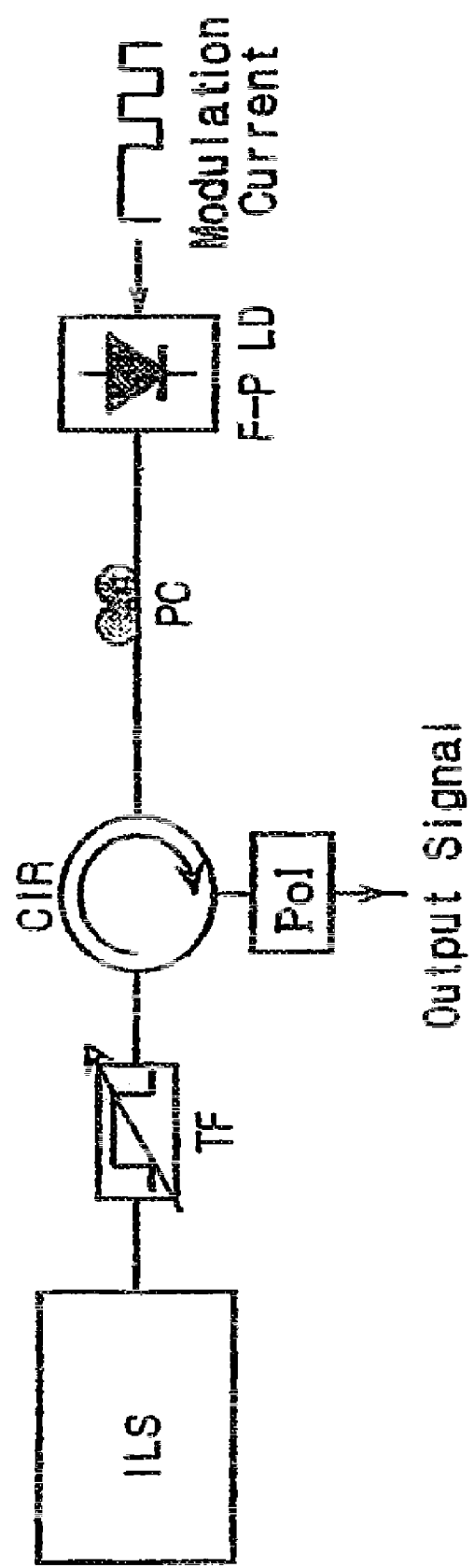
FIG. 2 shows the schematic diagram of the light source according to the present invention.

FIG. 2 is a schematic diagram of the light source according to the embodiment of the present invention. The light source comprises: an incoherent light source (ILS); a tunable optical filter (TF) connected to said incoherent light source; an optical circulator (CIR) connected to said tunable optical filter; and a F-P LD without optical isolator connected to said optical circulator.

Optionally, the light source according to the embodiment of the present invention further comprises: a polarization controllers (PC) connected between said optical circulator and said F-P LD; and a polarizer (Pol) connected at the output end of said optical circulator.

In the embodiment, the incoherent light source is any one of an optical fiber amplifier generating ASE, an LED, or a SLD.

The operation principles of the light source according to the present embodiment are as follows:

The broadband incoherent light generated from the incoherent light source is sliced by the tunable optical filter to produce a narrow-band incoherent light. The narrow-band incoherent light is injected into the F-P LD through the optical circulator. The optical circulator separates the narrow-band incoherent light and the output of F-P LD. Thus the output of the light source according to the present embodiment comes out through the output end of the optical circulator.

When the F-P LD is biased above the threshold current, the output of the F-P LD is multi-mode. However, it becomes wavelength-selective after injection of the narrow-band incoherent light since a strong light is coupled to a specific mode of the F-P LD. The output wavelength of F-P LD is locked to the injected incoherent light and thus can be tuned by changing the pass-band of the tunable optical filter.

The output power of the F-P LD can be changed by controlling the bias current applied to the F-P LD. Thus, we can modulate the light source directly. When the bias current is lower than the threshold current, the output of the light source is a reflected incoherent light at the interface of the pig-tailing fiber and the air. The output of F-P LD is polarized but reflected incoherent light is unpolarized. Using this characteristics, the extinction ratio of the modulated signal can be improved by further comprising a polarization controller (PC) and a polarizer (Pol).

In the light source according to the present embodiment, an optical circulator (CIR) can be replaced by an optical power splitter.

Using the same principles as that of the embodiments described above, multi-channel WDM light source can be implemented.

Figure 3:
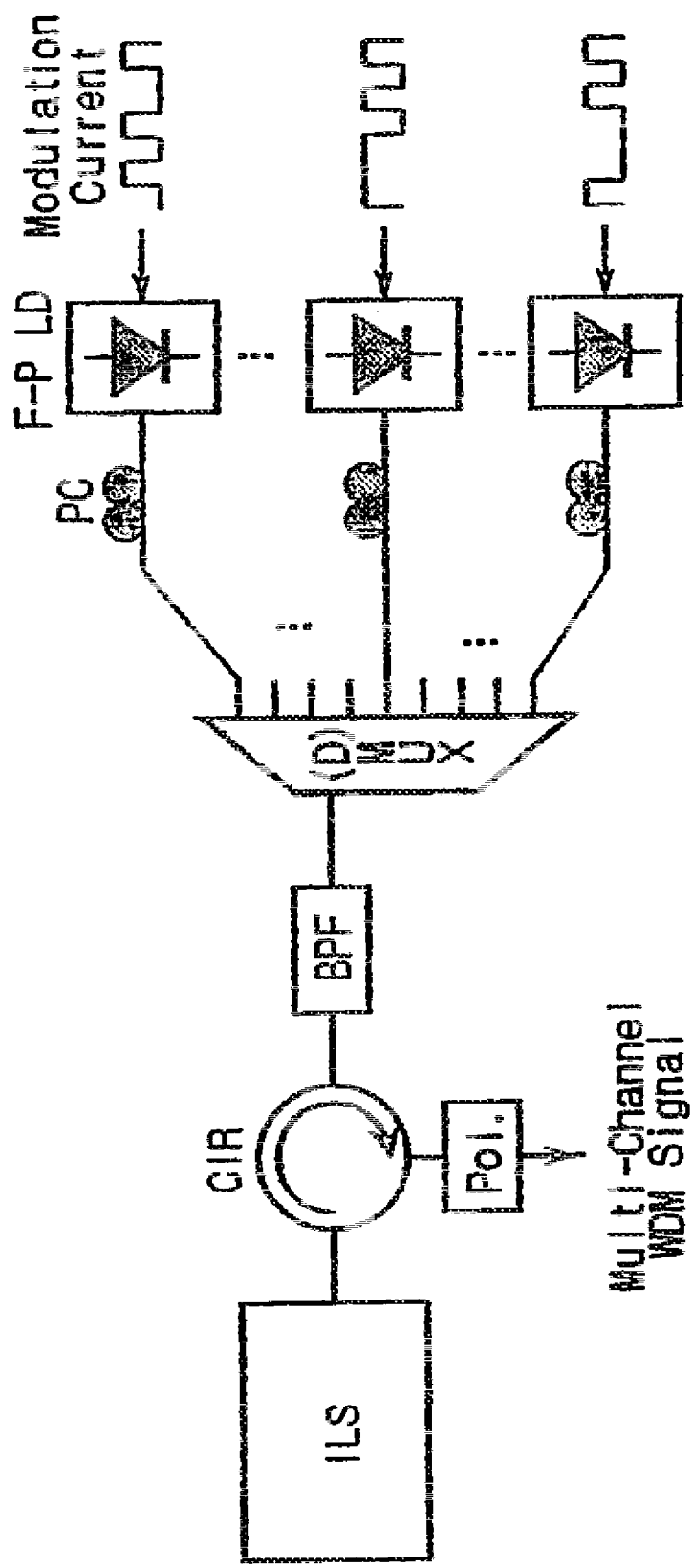
FIG. 3 is a schematic diagram of multi-channel WDM light sources in accordance with the present invention.

FIG. 3 shows schematic diagram of the multi-channel WDM light source in accordance with the embodiment of the present invention.

The multi-channel WDM light source comprises: an incoherent light source (ILS); an optical circulator (CIR) connected to said incoherent light source; a (de)multiplexer ((D)MUX) connected to said optical circulator; and plurality of F-P LDs without optical isolator connected at the output end of the said (de)multiplexer.

If the bandwidth of the incoherent light generated said incoherent light source is larger than the free spectral range (FSR) of said (de)multiplexer, the light source further comprises a band-pass filter (BPF) that is connected between said optical circulator (CIR) and said (de)multiplexer. The band-pass filter restricts the bandwidth of the incoherent light entering the (de)multiplexer within the free spectral range (FSR) of an the (de)multiplexer.

Optionally, the light source further comprises: plurality of polarization controllers (PC) connected between the output ends of the said (de)multiplexer and said F-P LDs; and a polarizer (Pol) connected at the output end of said optical circulator. In the embodiment, the incoherent light source is any one of an optical fiber amplifier generating ASE, an LED, or a SLD.

The operation principles of the multi-channel WDM light source in the present embodiment is as follows: The broadband incoherent light generated from the incoherent light source is transmitted to the (de)multiplexer through the optical circulator. The (de)multiplexer receives and slices the broadband incoherent light. Then, the sliced narrow-band incoherent light with different wavelengths are injected simultaneously into the plurality of F-P LDs.

After injection of incoherent light, the output of each F-P LD becomes wavelength-selective and is locked by the injected narrow-band incoherent light. Namely, the output wavelength of each F-P LD coincides with the peak wavelength of the (de)multiplexer pass-band. The outputs of the F-P LDs are multiplexed by the (de)multiplexer. Then, the multi-channel WDM signals come out through the output end of the optical circulator.

The output power of multi-channel WDM light source can be controlled independently and thus multi-channel WDM light source can be modulated directly. We can increase the extinction ratio of the modulated signal by further comprising a polarizer (Pol) and plurality of polarization controllers (PC).

In the multi-channel WDM light source according to the present embodiment, an optical circulator (CIR) can be replaced by an optical power splitter.

Figure 4A:
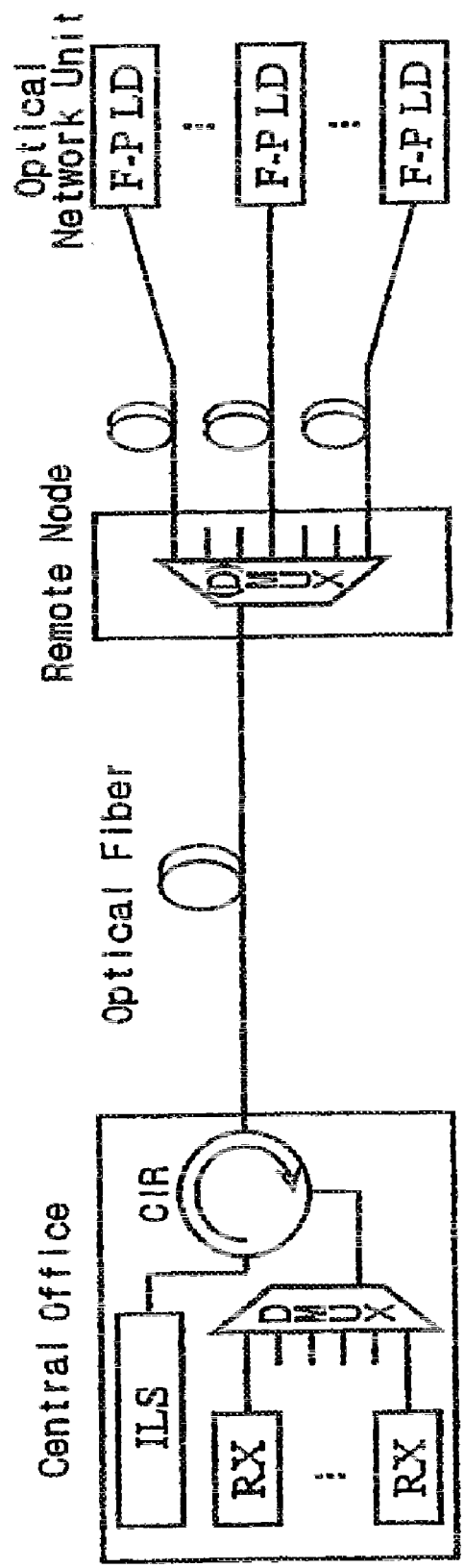
FIG. 4a and FIG. 4b show schematically the optical transmission systems for upstream signal transmission in passive optical networks employing the light source in accordance with an embodiment of the present invention.

FIG. 4a shows a schematic diagram the optical transmission system for upstream signal transmission in a passive optical network using the multi-channel WDM light source in accordance with the present invention.

The passive optical network of the present embodiment comprises a central office, a remote node connected to the central office with a single optical fiber, and plurality of optical network units connected to the remote node with plurality of optical fibers;

wherein the central office comprises: an incoherent light source (ILS); a demultiplexer (DMUX); an optical circulator that route the output of said incoherent light source to the optical fiber connecting said central office and said remote and the upstream signal transmitted from said remote through said optical fiber to said demultiplexer; and plurality of receivers (RX) connected at the output ends of the said demultiplexer, the remote node comprises: an (de)multiplexer that receives the broadband incoherent light transmitted from said central offices, slices said incoherent light spectrally to produce plurality of narrow-band incoherent lights and multiplexes the upstream signals from said optical network units, and the plurality of optical network units comprise a F-P LD that is connected to the output ends of the (de)multiplexer in the remote node with said plurality of optical fibers.

Under this configuration, the upstream signals generated from the optical network units have different wavelengths and multi-channel WDM signal is transmitted from the remote node to the central office.

In the passive optical network, electric power is not supplied to the remote node to save the maintenance cost, and thereby the pass-band of the (de)multiplexer in remote node can drift with the temperature change. Therefore, it is important to control the wavelength of the light sources in the optical network units. In case of the passive optical network using the multi-channel WDM light source according to the present invention, the output wavelength of each F-P LD is automatically aligned to the pass-band of the (de)multiplexer in remote node since the output wavelength of the F-P LD is locked by the injected incoherent light.

In the passive optical network described above, the broadband incoherent light transmitted from the central office to the remote node may be reflected to the central office due to the Rayleigh back-scattering of the optical fiber. The reflected light can degrade the signal quality.

Figure 4B:
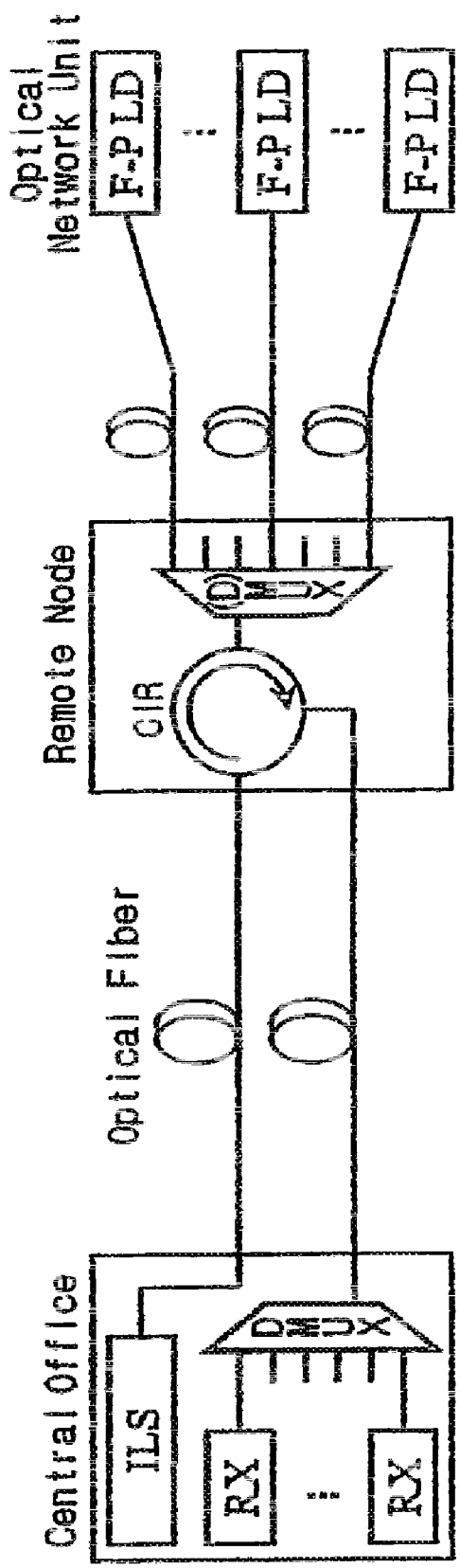

FIG. 4b shows a schematic diagram of the optical transmission system for upstream signal transmission in a passive optical network to reduce the signal degradation described above.

As described in the figure, by installing an optical circulator (CIR) at the remote node and separating the optical fiber that delivers the incoherent light from the optical fiber that deliver the upstream signal, the signal degradation caused by the reflection of the incoherent light can be reduced.

In other words, the passive optical network of the present embodiment comprises a central office, a remote node connected said central office with two optical fibers, and plurality of optical network units connected to said remote node with plurality of optical fibers;

wherein the central office comprises: an incoherent light source (ILS) connected to said remote node with an optical fiber; a demultiplexer (DMUX) connected to said remote with the other optical fiber and plurality of receivers (RX) connected at the output ends of the said demultiplexer, the remote node comprises: a (de)multiplexer that receives the broadband incoherent light transmitted from the central offices, slices said incoherent light spectrally to produce plurality of narrow-band incoherent lights, and multiplexes the upstream signals from said optical network units; and an optical circulator that route the broad-band incoherent light transmitted from said central office to said (de)multiplexer and the upstream signals from said (de)multiplexer to the central office, and the plurality of optical network units comprise F-P LDs connected to the output ends of the (de)multiplexer in the remote node with said plurality optical fibers.

Under this configuration, the upstream signals generated from the optical network units have different wavelengths and multi-channel WDM signal is transmitted from the remote node to the central office.

In optical transmission system for upstream signal transmission in a passive optical network described in FIG. 4a and FIG. 4b, an optical circulator (CIR) can be replaced by an optical power splitter.

Figure 5:
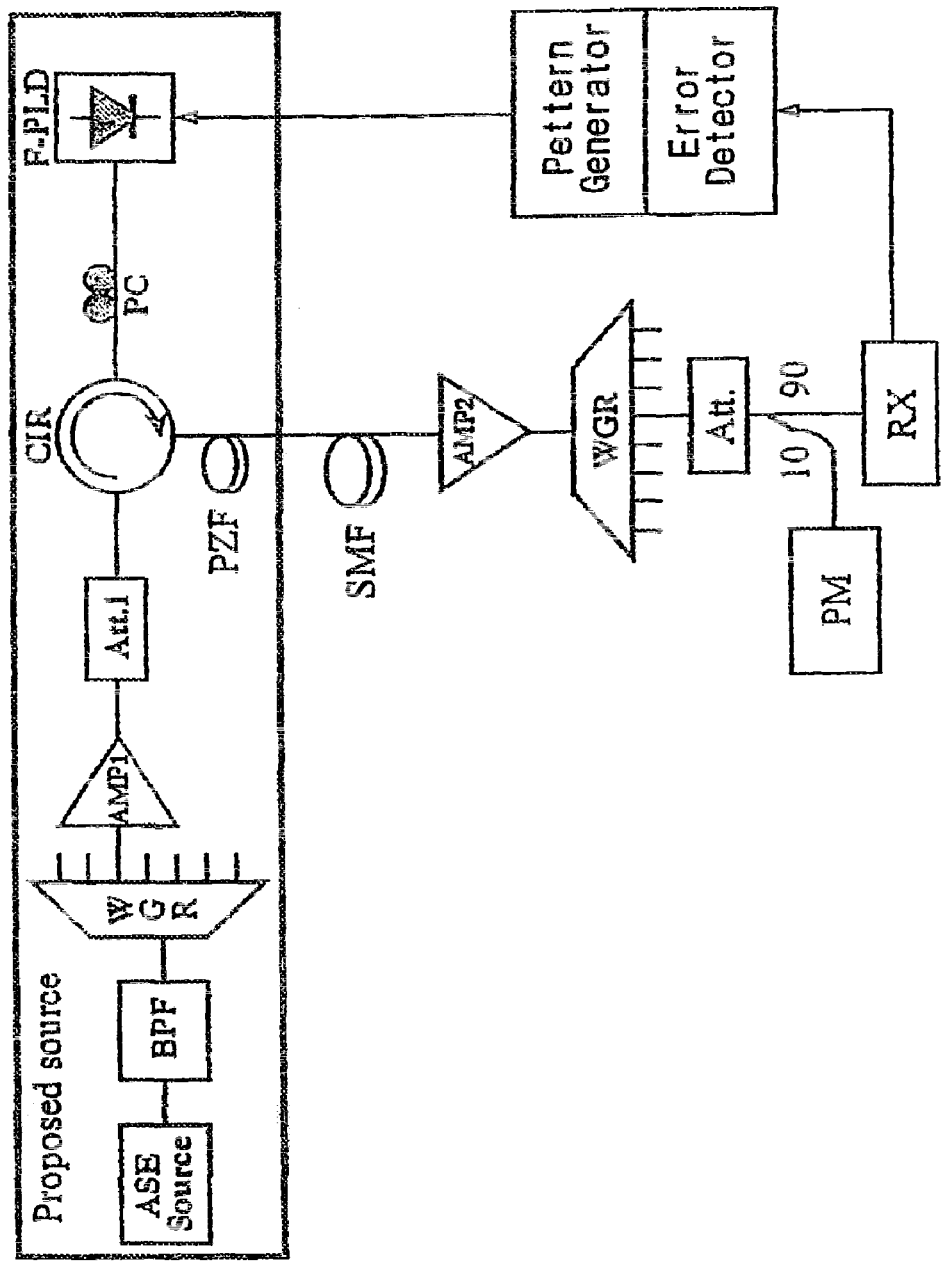
FIG. 5 shows the experimental set-up to demonstrate the feasibility of the light source in accordance with the present invention.

FIG. 5 shows the experimental set-up to demonstrate the feasibility of the light source in accordance with the present invention.

The ASE source was two-stage erbium-doped fiber amplifier (EDFA) pumped counter-directionally with laser diode at 1480 nm. The pump power for the first and the second stage of EDFA were 50 mW and 100 mW, respectively. A band pass filter (BPF) with a bandwidth of 9 nm was used at the output end of the EDFA to limit the spectral width of the ASE within one free spectral range (FSR) of the waveguide grating router (WGR). An optical amplifier (AMP1) and an optical variable attenuator (Att.1) were used to control the ASE power injected into the F-P LD. An optical circulator with insertion loss of 0.7 dB separated the injected broadband ASE and the output of the F-P LD. The broadband ASE was sliced spectrally by an WGR with a bandwidth of 0.24 nm and injected into the F-P LD. A conventional F-P LD without an optical isolator was locked by the externally injected narrow-band ASE. The threshold current of the F-P LD was 20 mA. The coupling efficiency of the F-P LD, the rate of power transferred from laser to pig-tailing fiber or vice versa, was approximately 8%. The F-P LD was modulated directly by pseudorandom nonreturn-to-zero data with a length of $2^7-1$ at 155 Mb/s and its output was transmitted through conventional single mode fiber (SMF). The transmitted data was amplified by an optical amplifier (AMP2), demultiplexed by another WGR with a bandwidth of 0.32 nm, and received by a PIN photo-detector based receiver to measure the bit error rate (BER) characteristics. The receiver input power was controlled by an optical variable attenuator (Att.2) and measured by an optical power meter (PM). A polarization controller (PC) and a polarizing fiber (PZF) with about 47 dB of polarization extinction ratio are used to improve the extinction ratio of the modulated optical signal.

Figure 6:
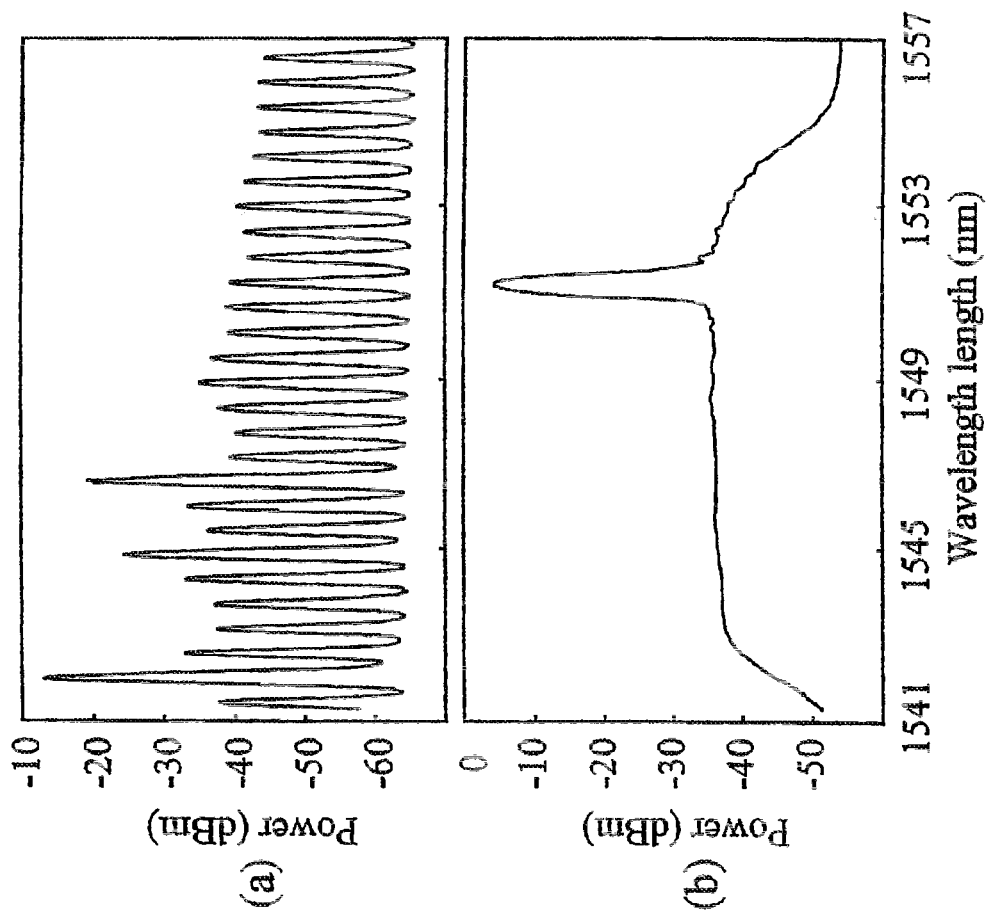
FIG. 6 shows (a) the output spectrum of the F-P LD without external light injection and (b) the spectrum of the narrow-band ASE to be injected into the F-P LD.

FIG. 6 shows (a) the output spectrum of the F-P LD without ASE injection and (b) the spectrum of the narrow-band ASE to be injected into the F-P LD. The bias current was 30 mA and the output power of the F-P LD measured at the output end of the optical circulator was about −10 dBm. The side mode suppression ratio (SMSR) was less than 6 dB. The peak wavelength of narrow-band ASE was about 1551.72 nm.

Figure 7:
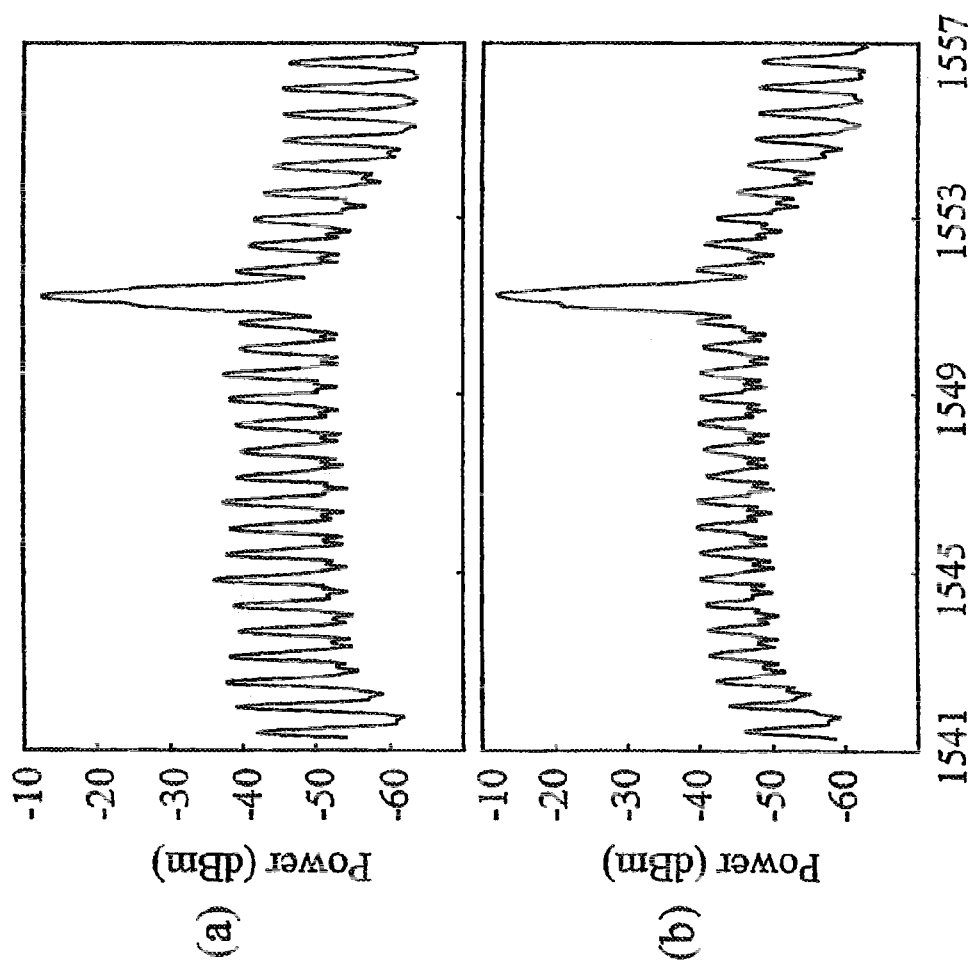
FIG. 7 shows the measured output spectra of the F-P LD after injection of a narrow-band ASE when the injection ASE power were (a) −2 dBm and (b) 2 dBm, respectively.

FIG. 7 shows the measured output spectra of the F-P LD after injection of a narrow-band ASE when the injected ASE power were (a) −2 dBm and (b) 2 dBm, respectively. After ASE injection, the F-P LD was wavelength-locked by the injected ASE. The measured side mode suppression ratio were 25 dB and 27.3 dB for the injection ASE power of −2 dBm and 2 dBm, respectively.

Figure 8:
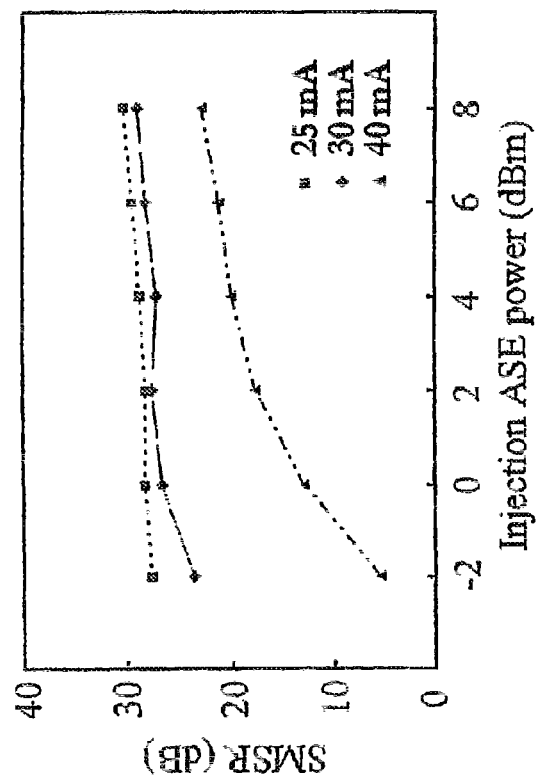
FIG. 8 shows the measured side-mode-suppression-ratio (SMSR) of the light source in accordance with the present invention.

FIG. 8 shows the measured side mode suppression ratio (SMSR) of the light source in accordance with the present invention. The side mode suppression ratios increases as the injected ASE power increases. However, it decreases as the bias current increases.

Figure 9:
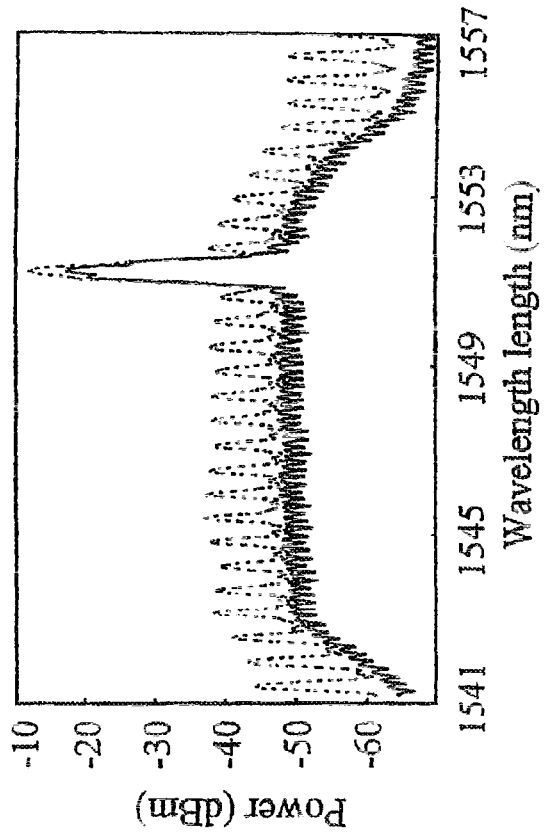
FIG. 9 shows the measured output spectra of the light source in accordance with the present invention for different bias currents.

To measure the modulation characteristics of the light source in accordance with the present invention, we measured optical spectra for different bias currents at the fixed injection ASE power of 2 dBm. FIG. 9 shows the results when the bias current were 30 mA (dotted line) and 0 mA (solid line), respectively. The measured peak power difference between two bias states, here called as extinction ratio, was about 5.8 dB.

Figure 10:
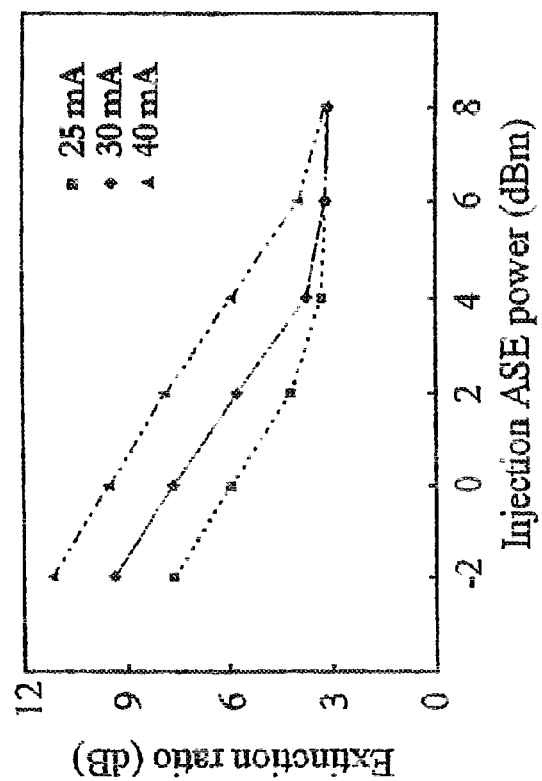
FIG. 10 shows the measured the extinction ratio of the light source in accordance with the present invention.

FIG. 10 shows the measured the extinction ratio of the light source in accordance with the present invention. The extinction ratio decreases as the injection ASE power increases while it increases the as the bias current increases.

Figure 11:
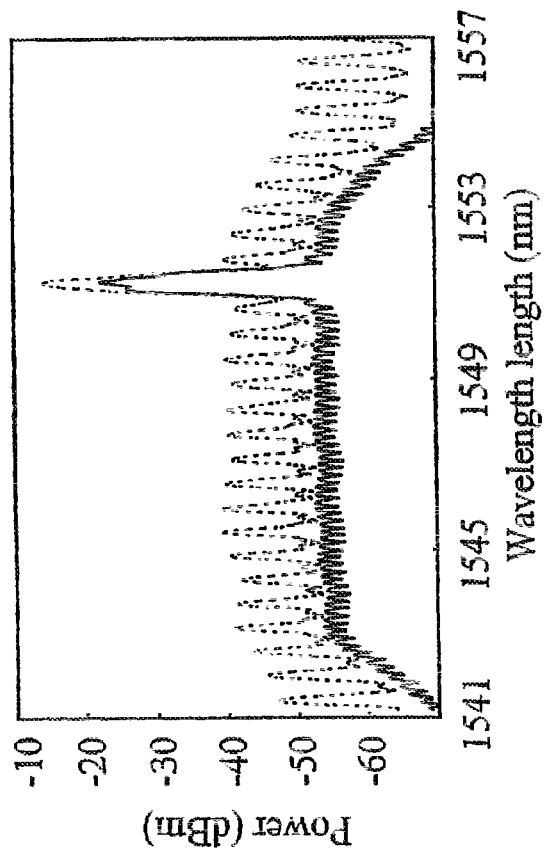
FIG. 11 shows the measured output spectra of the light source in accordance with the present invention when a polarizer and a polarization controller were further used.

We also measured optical spectra by inserting a polarization controller and a polarizer (in the present experiment, a polarizing fiber: PZF) under the same measurement conditions with the FIG. 9. FIG. 11 shows the results. The extinction ratio increases about 2.5 dB from 5.8 dB to 8.3 dB. This means that the output of the light source according to the present invention is polarized.

Figure 12:
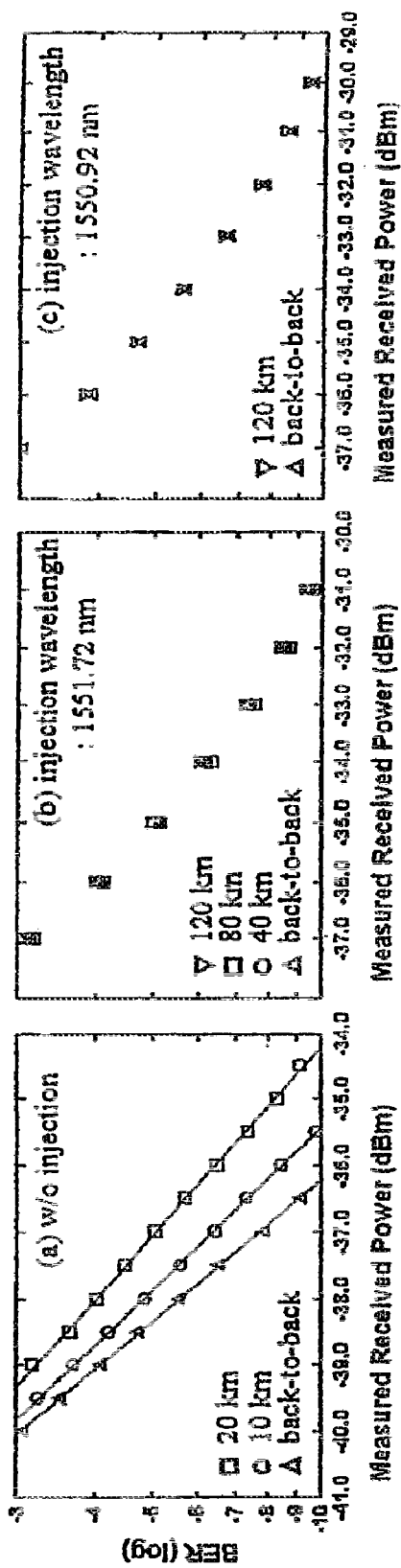
FIG. 12 shows the measured bit error rate.

FIG. 12 shows the measured bit error rate curves. The F-P LD was modulated directly at 155 Mb/s. The amplitudes of dc bias and modulation current were both 20 mA. Before we use the light source according to the present invention, we measured BER characteristics of the directly modulated F-P LD itself, i.e., without ASE injection. The measured power penalty at the BER of $10^{-9}$ was about 2 dB after transmission over 20 km of SMF as shown in FIG. 12 (a).

The BER characteristics were improved dramatically when we inject a narrow-band ASE into the F-P LD. The power and the peak wavelength of the injected ASE were 1 dBm and 1551.72 nm, respectively. We achieved error free transmission over 120 km of SMF with negligible power penalty as shown in FIG. 12 (b). We also measured BER characteristics by changing the peak wavelength of the injected narrow-band ASE and observed very similar results. As an example, we show the measured BER curves in FIG. 12 (c) when the peak wavelength of the injected narrow-band ASE was 1550.92 nm. This result implies that the output wavelength of the light according to the present invention can be tuned by changing the wavelength of the injected ASE.

Since those having ordinary knowledge and skill in the art of the present invention will recognize additional modifications and applications within the scope thereof, the present invention is not limited to the embodiments and drawings described above.

What is claimed is:

1. A multi-channel WDM light source comprising:
an incoherent light source that generates a broadband incoherent light;
an optical circulator coupled to the incoherent light source;
a demultiplexer coupled to the optical circulator, wherein the optical circulator is configured to route the broadband incoherent light to the demultiplexer and to separate an output of the demultiplexer from the broadband incoherent light, wherein the demultiplexer is configured to receive the broadband incoherent light, to slice spectrally the broadband incoherent light to produce a plurality of narrow-band incoherent lights; and
a plurality of light sources capable of lasing that are connected at output ends of the demultiplexer, wherein the demultiplexer is further configured to multiplex outputs of the plurality of light sources capable of lasing, wherein at least one of the plurality of light sources capable of lasing is configured to emit a wavelength-selective output locked by one of the narrow-band incoherent lights, wherein the at least one of the plurality of light sources capable of lasing is configured to be modulated directly, wherein the at least one of the plurality of light sources capable of lasing is configured to have a side mode suppression ratio of the wavelength-selective output increased by increasing a power of the one of the narrow-band incoherent lights.

2. The multi-channel WDM light source of claim 1, wherein the plurality of light sources comprise Fabry-Perot laser diodes.

3. The multi-channel WDM light source of claim 1, wherein the broadband incoherent light has a bandwidth within a free spectral range (FSR) of the demultiplexer.

4. The multi-channel WDM light source of claim 1, further comprising of polarization controllers between the output ends of the demultiplexer and the plurality of light sources.

5. The multi-channel WDM light source of claim 1, further comprising a polarizer coupled to an output of the optical circulator.

6. The multi-channel WDM light source of claim 1, further comprising an optical power splitter that replaces the optical circulator that is coupled to the incoherent light source and to the demultiplexer.

7. The multi-channel WDM light source of claim 1, further comprising a band pass filter between the demultiplexer and the optical circulator.

8. The multi-channel WDM light source of claim 1, wherein a bias current is applied to the at least one of the light sources capable of lasing, and wherein the at least one of the light sources capable of lasing is configured to have the side mode suppression ratio of the wavelength locked output decreased by increasing the bias current.

* * * * *